(12) United States Patent
Glezer et al.

(10) Patent No.: US 8,672,648 B2
(45) Date of Patent: Mar. 18, 2014

(54) METHODS FOR REDUCING THE NON-LINEAR BEHAVIOR OF ACTUATORS USED FOR SYNTHETIC JETS

(75) Inventors: Ari Glezer, Atlanta, GA (US); Robert G. Diamond, Austin, TX (US); Raghavendran Mahalingam, Austin, TX (US); Samuel Neil Heffington, Austin, TX (US); Daniel N. Grimm, Round Rock, TX (US); Markus Schwickert, Austin, TX (US)

(73) Assignee: Nuventix, Inc., Austin, TX (US)

( * ) Notice: Subject to any disclaimer, the term of this patent is extended or adjusted under 35 U.S.C. 154(b) by 1162 days.

(21) Appl. No.: 11/804,898

(22) Filed: May 21, 2007

(65) Prior Publication Data

US 2008/0043061 A1 Feb. 21, 2008

Related U.S. Application Data

(60) Provisional application No. 60/802,954, filed on May 23, 2006.

(51) Int. Cl.
*F04B 17/00* (2006.01)

(52) U.S. Cl.
USPC .................................. 417/413.1; 417/151

(58) Field of Classification Search
USPC ........ 417/151, 410.1, 411, 412, 413.1, 413.2, 417/413.3; 310/12.16, 12.04, 12.21–12.27, 310/12.3, 12.29, 15, 14; 381/396, 401, 412, 381/417, 418, 404; 267/102, 158, 160, 164, 267/165; 5/247, 255, 719

See application file for complete search history.

(56) References Cited

U.S. PATENT DOCUMENTS

| | | | | |
|---|---|---|---|---|
| 2,722,815 A * | 11/1955 | Wickardt | .................. | 66/110 |
| 3,848,720 A * | 11/1974 | Carlsen | .................. | 101/487 |
| 4,811,406 A * | 3/1989 | Kawachi | .................. | 381/186 |
| 6,385,327 B1 * | 5/2002 | D'Hoogh | .................. | 381/398 |
| 6,588,497 B1 * | 7/2003 | Glezer et al. | .................. | 165/84 |
| 2007/0154059 A1 * | 7/2007 | Ohara | .................. | 381/404 |
| 2007/0187172 A1 * | 8/2007 | Kaneda et al. | .................. | 181/181 |
| 2008/0055083 A1 * | 3/2008 | Yu | .................. | 340/571 |

FOREIGN PATENT DOCUMENTS

WO   WO 2005084073 A1 *   9/2005   ............... H04R 9/02

* cited by examiner

*Primary Examiner* — Peter J Bertheaud
*Assistant Examiner* — Dnyanesh Kasture
(74) *Attorney, Agent, or Firm* — Fortkort & Houston P.C.; John A. Fortkort

(57) ABSTRACT

A synthetic jet ejector (101) is provided herein which comprises a diaphragm (119), a first voice coil (121) disposed on a first side of the diaphragm, and a second voice coil (123) disposed on a second side of the diaphragm.

20 Claims, 18 Drawing Sheets

METHODS FOR REDUCING THE NON-LINEAR BEHAVIOR OF ACTUATORS USED FOR SYNTHETIC JETS

CROSS-REFERENCE TO RELATED APPLICATION

This application claims priority to U.S. provisional patent application Ser. No. 60/802,954 (Glezer et al.) filed on May 23, 2006 and incorporated herein by reference in its entirety.

FIELD OF THE DISCLOSURE

The present disclosure relates generally to synthetic jet ejectors, and more specifically to methods and devices for reducing the audible footprint of synthetic jet ejectors.

BACKGROUND OF THE DISCLOSURE

As the size of semiconductor devices has continued to shrink and circuit densities have increased accordingly, thermal management of these devices has become more challenging. In the past, thermal management in semiconductor devices was often addressed through the use of forced convective air cooling, either alone or in conjunction with various heat sink devices, and was accomplished through the use of fans. However, fan-based cooling systems are undesirable due to the noise attendant to their use. Moreover, the use of fans requires relatively large moving parts, and corresponding high power inputs, in order to achieve the desired level of heat transfer. Furthermore, while fans are adequate for providing global movement of air over electronic devices, they generally provide insufficient localized cooling to provide adequate heat dissipation for the hot spots that typically exist in semiconductor devices and in many types of electronic equipment.

More recently, thermal management systems have been developed which utilize synthetic jet ejectors. These systems are more energy efficient than comparable fan-based systems, and also offer reduced levels of noise and electromagnetic interference. Systems of this type are described in greater detail, for example, in U.S. Pat. No. 6,588,497 (Glezer et al.). The use of synthetic jet ejectors has proven very efficient in providing localized heat dissipation, and hence can be used to address hot spots in semiconductor devices and electronic equipment. Synthetic jet ejectors may be used in conjunction with fan-based systems to provide thermal management systems that afford both global and localized heat dissipation.

Despite their notable advantages, there is a need in the art for further improvements in synthetic jet ejectors. In particular, there is a need in the art for synthetic jet ejectors which have a reduced audible footprint. This need is especially great in hand-held devices such as cell phones, where the audible footprint of the thermal management system may detract from the usage of the device. At the same time, such applications require that the synthetic jet ejectors have a low profile and consume a relatively small amount of space. These and other needs may be met by the systems and methodologies disclosed herein.

SUMMARY OF THE DISCLOSURE

Figure 1:
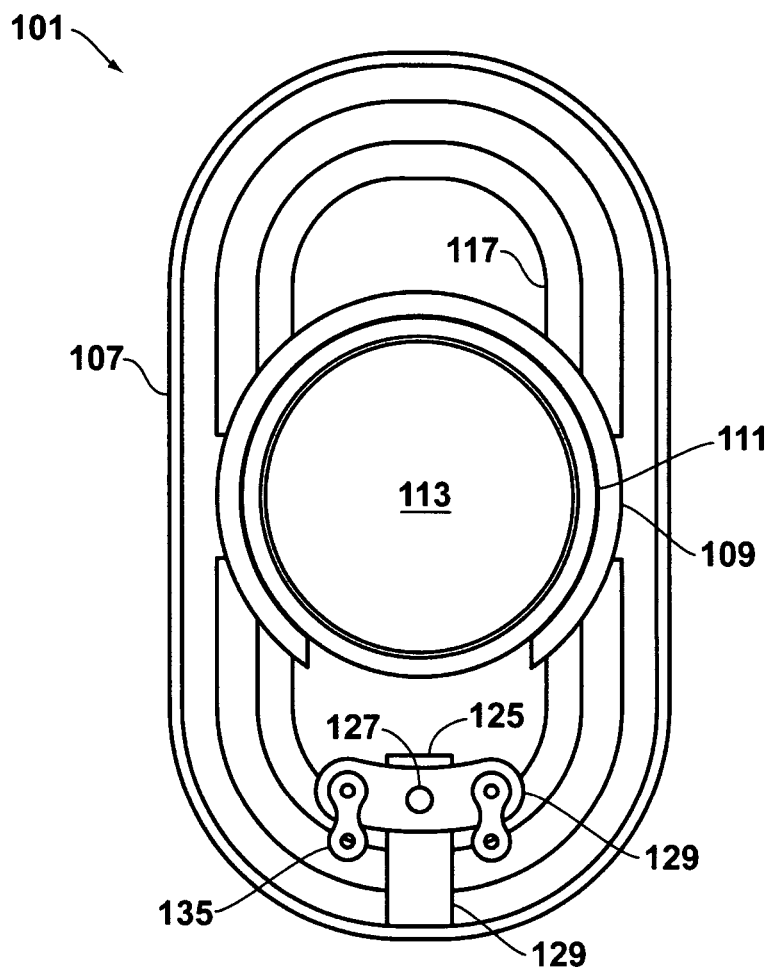
FIG. 1 is a top view of an embodiment of a synthetic jet actuator made in accordance with the teachings herein.
Figure 2:
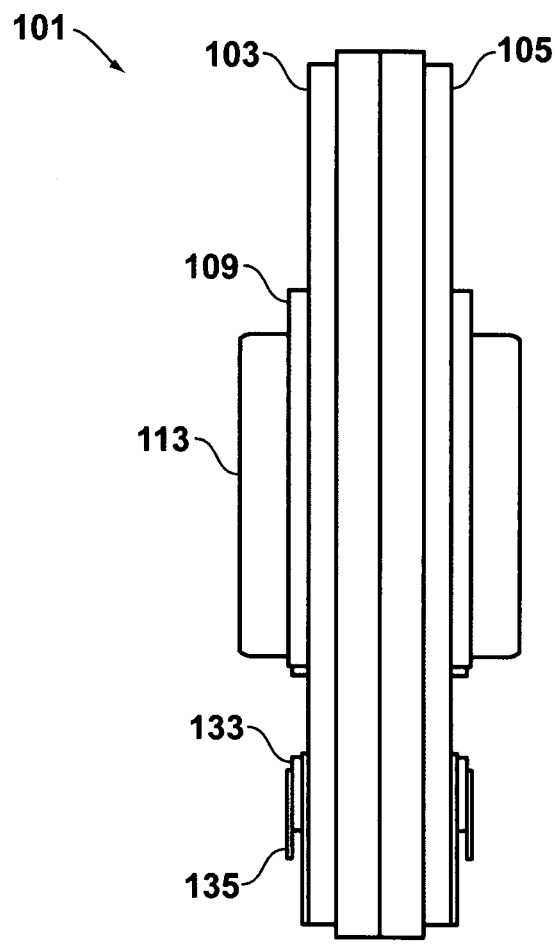
FIG. 2 is a side view of the synthetic jet actuator of FIG. 1.
Figure 3:
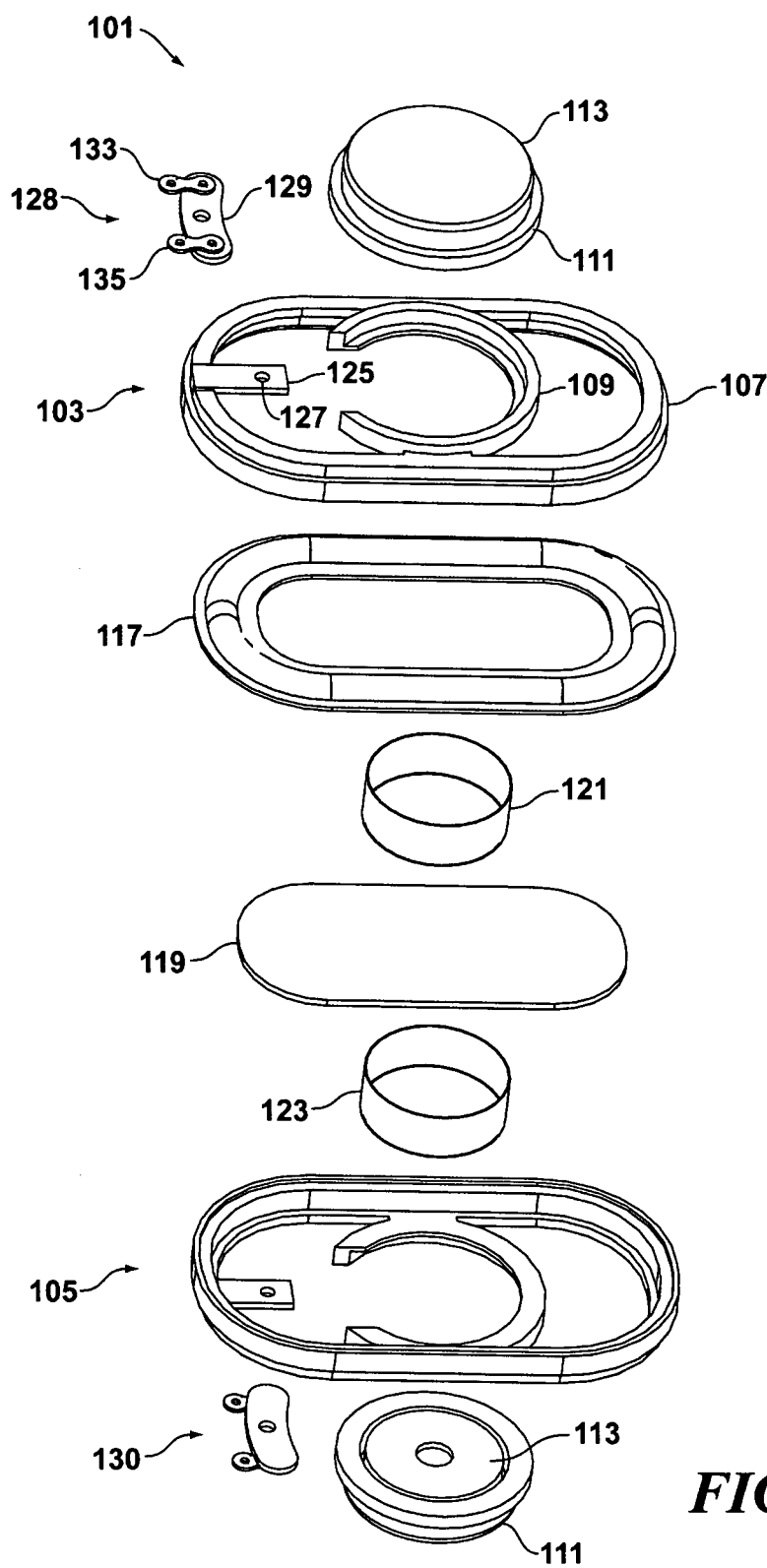
FIG. 3 is an exploded view of the synthetic jet ejector of FIG. 1.
Figure 4:
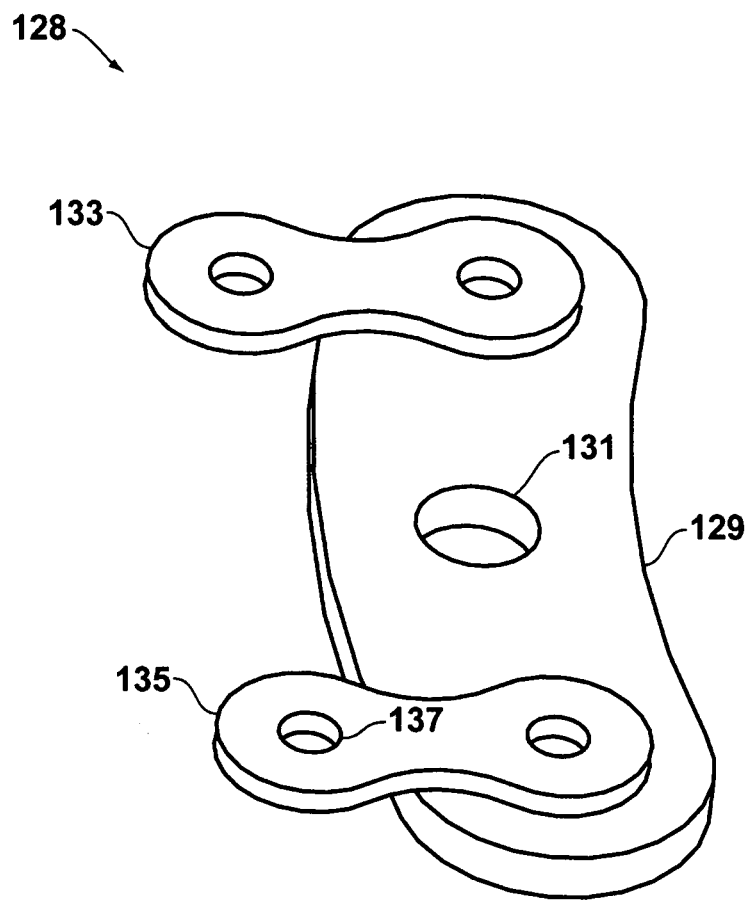
FIG. 4 is a magnified few of the bracket utilized in the synthetic jet actuator of FIG. 3.

In one aspect, a synthetic jet ejector is provided herein which comprises a diaphragm, a first voice coil disposed on a first side of said diaphragm, and a second voice coil disposed on a second side of said diaphragm.

In another aspect, a synthetic jet ejector is provided herein which comprises a transducer having an essentially symmetric magnetic flux field.

In a further aspect, a synthetic jet ejector is provided herein which comprises an actuator equipped with a diaphragm, a surround which supports said diaphragm, and at least one spring which is adapted to reduce the lateral movement of said diaphragm.

In yet another aspect, a synthetic jet ejector is provided herein which comprises a wall which encloses an interior space, and an aperture in open communication with said interior space, and wherein at least a portion of said wall comprises a piezoelectric material.

In still another aspect, a synthetic jet ejector is provided herein which comprises a housing which encloses an interior space, an aperture in open communication with said interior space, and an actuator disposed and said housing, said actuator comprising a piezoelectric material.

In yet another aspect, a synthetic jet ejector is provided herein which comprises a diaphragm, a first voice coil, and an alignment structure which is adapted to restrict the lateral motion of said diaphragm.

In a further aspect, a synthetic jet ejector is provided herein which comprises an actuator equipped with a diaphragm, a voice coil attached to said diaphragm, a housing, and at least one structure disposed between said voice coil and said housing which is adapted to reduce the lateral movement of said diaphragm.

These and other aspects of the present disclosure are described in greater detail below.

DETAILED DESCRIPTION

It has now been found that the audible footprint of a synthetic jet ejector can be reduced or eliminated by controlling the relative motion of the voice coil, the permanent magnet, and/or the diaphragm such that motion of the diaphragm and/or voice coil is primarily restricted to an axis perpendicular to the major plane of the diaphragm, and such that lateral motion (including wobble) of the voice coil and/or diaphragm is reduced, minimized or eliminated.

Without wishing to be bound by theory, it is believed that such lateral motion, which may manifest itself as (or which may be caused by) asymmetries in the magnetic field and magnetic flux lines about the diaphragm, can contribute to the audible footprint of the synthetic jet ejector. By reducing, minimizing, or eliminating such lateral motion, audible noise produced by the synthetic jet injector may be subsequently reduced. In some cases, the symmetry of the magnetic flux lines may thus be used as a modeling tool to reduce the audible footprint of a proposed synthetic jet ejector design.

These principles may be further appreciated with respect to FIGS. 1-4, which illustrate a first particular, non-limiting embodiment of an actuator 101 for a synthetic jet ejector made in accordance with the teachings herein. The actuator 101 comprises first 103 and second 105 baskets which form the framework of the device. Each of the first 103 and second 105 baskets comprises a perimeter frame 107 having a mount 109 attached thereto within which sits a magnet 113 and a pot 111. A suspension 117 is also provided which sits within the perimeter frame 107 of the first basket 103. In some embodiments of the actuator, an additional suspension may also be provided which sits within the second basket 105. The actuator 101 also comprises a diaphragm 119. The diaphragm 119 is disposed between the first 103 and second 105 baskets.

The perimeter frame 107 of each of the first 103 and second 105 baskets is provided with a tab 125 having an aperture 127 therein. A bracket 129 is provided which is equipped with a central aperture 131 and which has first 133 and second 135 rotatable tabs attached to the distal ends thereof. A fastener (not shown) is provided to secure the bracket to the tab. The bracket acts as a contact plate for the wires that provide current to the voice coils 121 of the actuator. To that end, each of the first and second rotatable tabs is provided with an aperture 137 through which a wire lead may be inserted.

In use, the voice coils 121 extend into the circular groove defined by the space between the permanent magnet 113 and the pot 111 in response to the polarity of the current running through the voice coils 121. The polarity of the voice coils 121 may be independently controlled so that a desired motion may be imparted to the diaphragm 119.

In a physical sense, the actuator 101 of FIGS. 1-4 comprises, in essence, a single piston with two coils that are linked so that the force profile experienced by the diaphragm and voice coil is essentially the same on both the outstroke and the in-stroke of the device. Such a configuration can cut down significantly on the audible footprint of the device because, when the force profile is uneven, the unequal forces attendant to the outstroke and in-stroke can result in substantial audible harmonic distortions.

Figure 18:
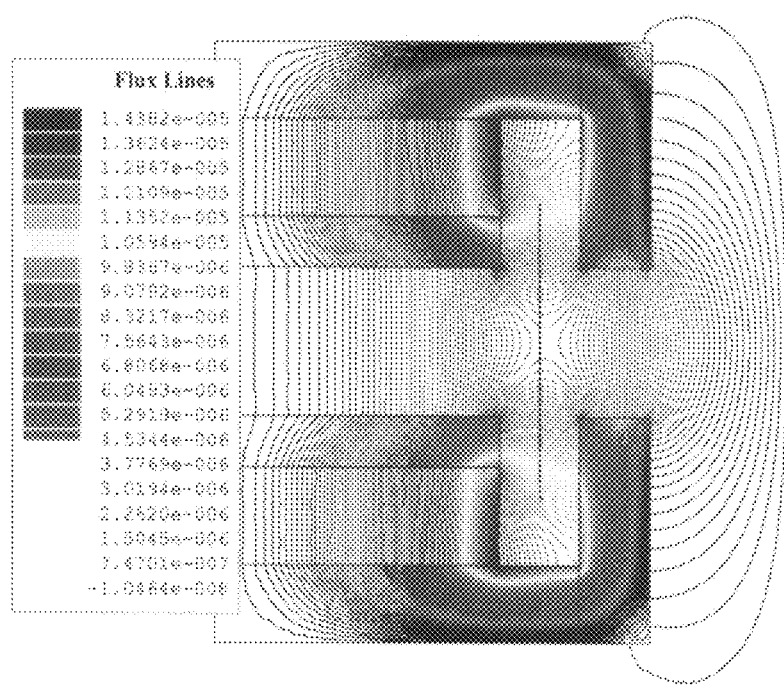
FIG. 18 is a graph of the predicted magnetic flux lines for a synthetic jet actuator of the type depicted in FIG. 1.

This advantage of the actuator depicted in FIGS. 1-4 may be appreciated with respect to FIG. 18. The graph depicted therein shows the magnetic flux lines for the synthetic jet actuator of in FIGS. 1-4. The region of the graph corresponds to a portion of the device taken in a cross-sectional plane near one edge of the device, and which is perpendicular to both the permanent magnets 113 and the voice coils 123. Notably, as indicated by the magnetic flux lines, the magnetic field is symmetrical about a mirror plane which bisects the actuator 101 and which is parallel to (and indeed coplanar with) the diaphragm 119.

One skilled in the art will appreciate that an actuator of the type depicted in FIGS. 1-4 may be provided with housings having various geometries. Such housings may be, for example, cylindrical in shape, and may have cross-sections which are polygonal (including, without limitation, triangular, square, rectangular, pentagonal, hexagonal, or octagonal), elliptical, circular, or irregular in shape, or combinations of the foregoing, and maybe equipped with nozzles, apertures, tubes, or various other components, devices or accessories as may be needed to form a complete synthetic jet ejector.

In the device of FIGS. 1-4, vibrations are imparted to the diaphragm 119 through the movement of the voice coils 121 and 123, and the magnet 113 remains stationery. However, various embodiments are also possible in accordance with the teachings herein in which the magnet is made to move, and in which the voice coil (or coils) remain stationary. Some such embodiments are depicted in FIGS. 5-8.

Figure 5:
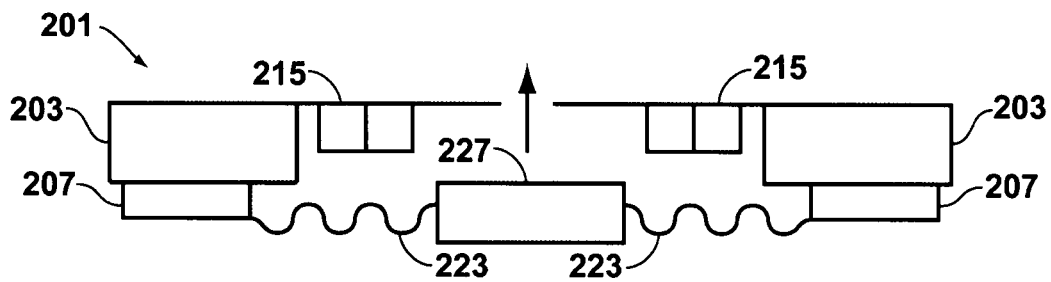
FIG. 5 is an illustration of an embodiment of a moving magnetic actuator in accordance with the teachings herein.

FIG. 5 depicts a particular, non-limiting embodiment of an actuator made in accordance with the teachings herein. The actuator 201 comprises a housing 203 and a basket 207. A stationary coil 215 is attached to an interior surface of the housing 203. A magnet 227 is suspended within the housing by way of a surround 223. In use, as the polarity of the coil 215 is oscillated, the magnet 227 is made to move up and down along a longitudinal axis as indicated by the arrow.

Figure 6:
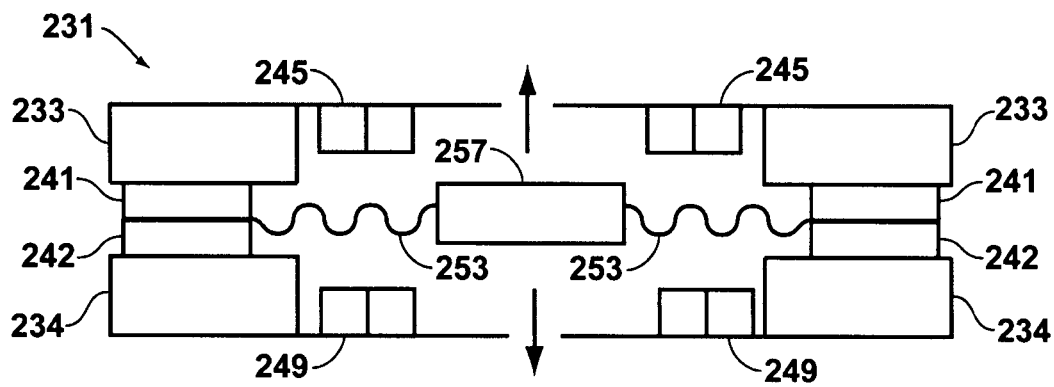
FIG. 6 is an illustration of an embodiment of a moving magnetic actuator in accordance with the teachings herein.

FIG. 6 illustrates a particular, non-limiting embodiment of an actuator made in accordance with the teachings herein which is similar to that depicted in FIG. 5, except that an opposing set of voice coils is provided to control the movement of the magnet. Hence, the actuator 231 of FIG. 6 comprises first 233 and second 234 housing components and first 241 and second 242 baskets. First 245 and second 249 stationary voice coils are attached to interior surfaces of the first 233 and second 234 housing components. A magnet 257 is suspended within the housing (formed by the housing components) by way of a surround 253.

In use, as the polarity of the first 245 and second 249 stationary voice coils are reversed, the magnet 257 is made to move up and down along a longitudinal axis as indicated by the arrows. In contrast to the actuator 201 depicted in FIG. 5 in which the magnetic flux lines are not symmetric about the magnet 227 (that is, the magnet 227 interacts with fewer flux lines as it moves away from the voice coil 215 than when it moves toward it), the provision of the second voice coil 249 in the actuator 231 of FIG. 6 creates symmetry in the magnetic flux lines about the magnet 257. This has the effect of minimizing the audible footprint of the actuator 231.

Figure 7:
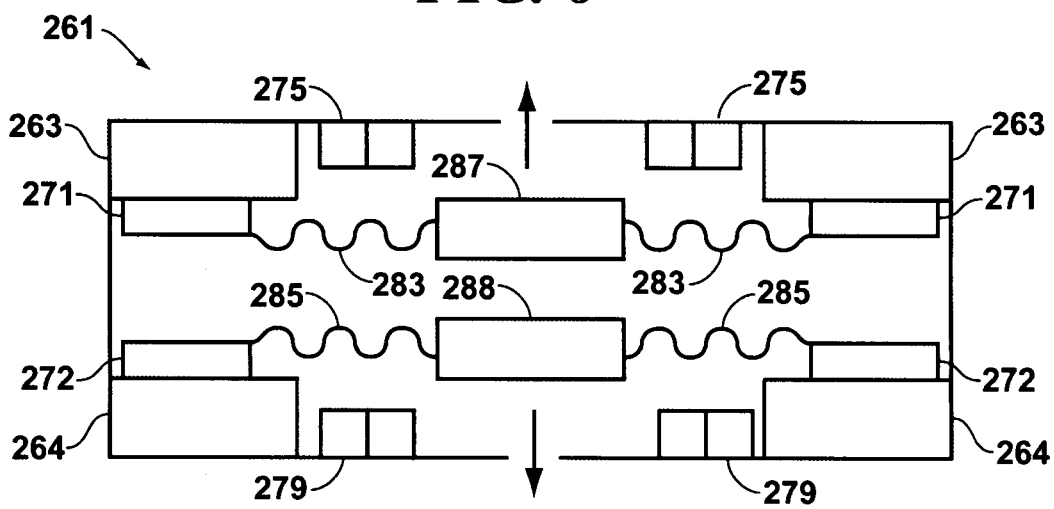
FIG. 7 is an illustration of an embodiment of a moving magnetic actuator in accordance with the teachings herein.

FIG. 7 illustrates a particular, non-limiting embodiment of an actuator made in accordance with the teachings herein which is similar to that depicted in FIG. 6, except that two magnets are utilized. Hence, the actuator 261 of FIG. 7 comprises first 263 and second 264 housing components and first 271 and second 272 baskets. First 275 and second 279 stationary voice coils are attached to interior surfaces of the first 273 and second 274 housing components. First 287 and second 288 magnets are suspended from the first 263 and second 264 housing components, respectively, by way of respective first 283 and second 285 surrounds.

In use, as the polarity of the first 275 and second 279 stationary voice coils are oscillated, the first 287 and second 288 magnets are made to move up and down along a longitudinal axis as indicated by the arrows. The first 275 and second 279 stationary voice coils may be driven in phase or out of phase.

Figure 8:
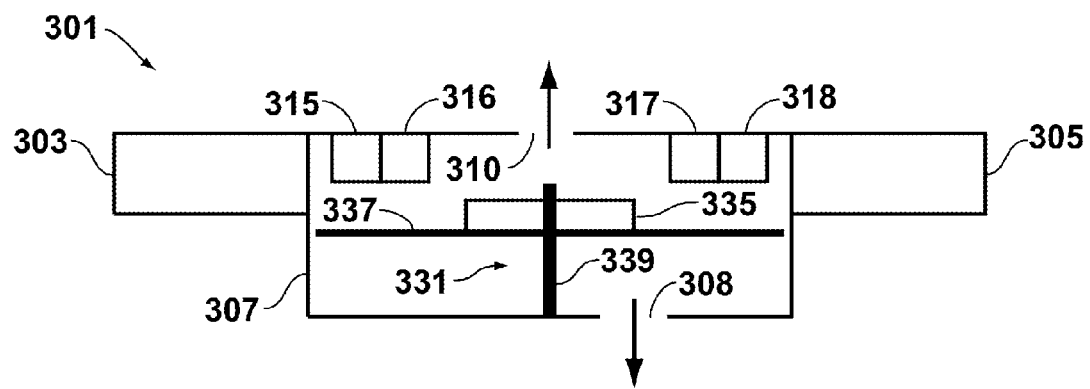
FIG. 8 is an illustration of an embodiment of a rigid piston actuator in accordance with the teachings herein.

FIG. 8 illustrates a particular, non-limiting embodiment of an actuator made in accordance with the teachings herein which is similar in some respects to the actuator depicted in FIG. 5. The actuator 301 of FIG. 8 comprises a housing 303 having first 308 and second 310 apertures disposed therein. A voice coil 315 is disposed on an interior surface of the housing 301. A diaphragm 337 having a magnet 335 mounted thereon is disposed within the housing 303. An alignment pin 339 is provided which is affixed to an interior surface of the housing 303 and which extends through a central aperture provided in the diaphragm 337 and the magnet 335. Preferably, a viscous seam exists between the aperture/magnet and the alignment pin 339 and between the diaphragm 337 and the adjacent wall of the housing 303, and which may be maintained through application of a suitable lubricant.

In use, the diaphragm 337 moves up and down along the vertical axis of the alignment pin 339 as the polarity of the voice coil is oscillated. In so doing, the alignment pin 339 prevents the diaphragm 337 from moving in an off-axis direction. As previously discussed, the limitation or reduction of this lateral motion may help to reduce the audible footprint of the actuator 301.

Figure 9:
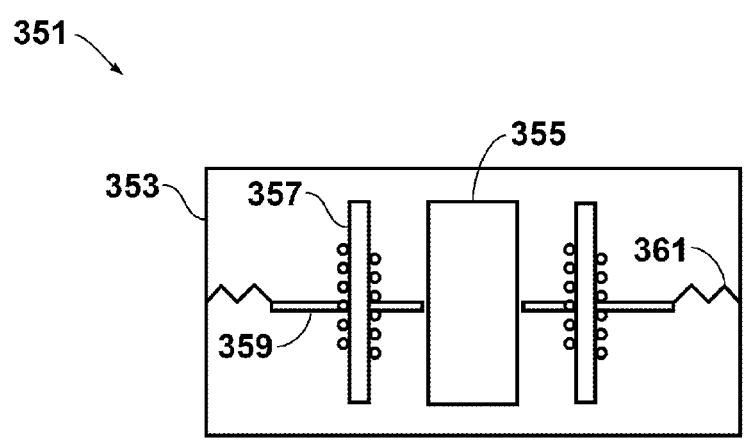
FIG. 9 is an illustration of an embodiment of an actuator in accordance with the teachings herein.

FIG. 9 depicts a particular, non-limiting embodiment of an actuator made in accordance with the teachings herein which utilizes a total symmetry approach. The actuator 351 comprises a housing 353 having a permanent magnet 355 disposed therein. A voice coil 357 is provided which surrounds the permanent magnet 355. The actuator 351 also contains a diaphragm 359 which is supported by way of a surround 361. The diaphragm 359 is equipped with a central aperture which is slightly larger than the permanent magnet 355, and which may also be equipped with one or more apertures or openings to accommodate the voice coil 357. Preferably, a viscous seam exists between the aperture and the permanent magnet 355 which may be maintained through application of a suitable lubricant.

In use, the diaphragm 359 moves up and down along the vertical axis of the permanent magnet 355 as the polarity of the voice coil 357 is oscillated. In so doing, the permanent magnet 355 acts as an alignment pin which prevents the diaphragm 359 from moving in an off-axis direction, thereby helping to reduce or minimize the audible footprint of the actuator 351.

FIGS. 10-16 illustrate various possible, non-limiting configurations for a synthetic jet actuator which may be utilized in accordance with the teachings herein to achieve low total harmonic distortion (THD) and/or pure harmonic distortion.

Figure 10:
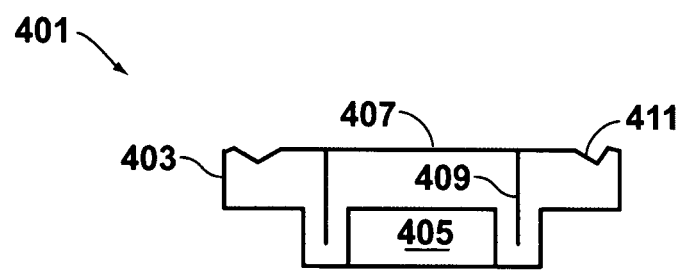
FIG. 10 is an illustration of a synthetic jet actuator in accordance with the teachings herein.

FIG. 10 depicts a single suspension actuator for a synthetic jet ejector. The configuration 401 depicted in FIG. 10 comprises a housing 403 within which resides a permanent magnet 405. A diaphragm 407 is spaced apart from the magnet 405 and is equipped with a voice coil 409 that extends into the space between the magnet 405 and the housing 403 (note that the figure is cross-sectional, so that the coil 409, though preferably cylindrical, appears as two parallel lines). The diaphragm 407 is supported from the housing 403 by a surround 411.

Figure 11:
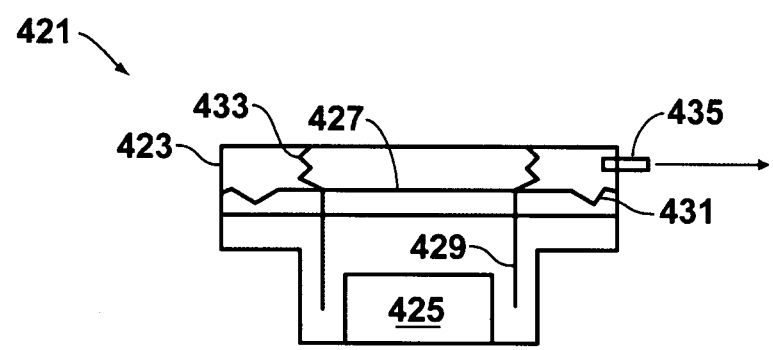
FIG. 11 is an illustration of a synthetic jet actuator in accordance with the teachings herein.

FIG. 11 illustrates another specific, non-limiting embodiment of an actuator for a synthetic jet ejector made in accordance with the teachings herein. The actuator 421 depicted therein is a dual suspension actuator comprising a housing 423 having a permanent magnet 425 disposed therein. A diaphragm 427 is provided in the housing 423 which has a voice coil 429 suspended therefrom such that the voice coil 429 extends into a gap between the permanent magnet 425 and the housing 423. In this particular embodiment, the housing is provided with a nozzle 435 from which is emitted a synthetic jet, though one skilled in the art will appreciate that an actuator of the type depicted in FIG. 11 may be disposed within, or integrated with, a separate housing that is equipped with nozzles, apertures, or other such components as are utilized in the construction of a synthetic jet ejector.

The diaphragm 427 is attached to the housing 423 by way of a surround 431, and further by way of one or more springs 433. The additional springs 433 provide a further restoring force to the diaphragm 427, thereby helping to eliminate distortions of the diaphragm 427 which might contribute the audible footprint of the actuator 421. The actuator 421 of FIG. 11 takes advantage of the opposing surface present adjacent to the diaphragm (which would typically not be present in a conventional speaker application) to provide a point of attachment for the springs 433.

Figure 12:
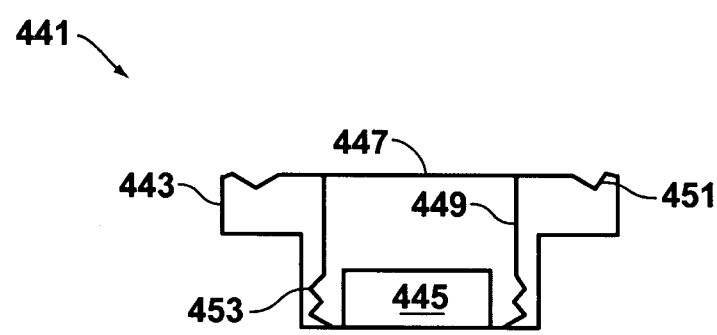
FIG. 12 is an illustration of a synthetic jet actuator in accordance with the teachings herein.

FIG. 12 illustrates a further specific, non-limiting embodiment of an actuator for a synthetic jet ejector made in accordance with teachings herein. The actuator 441 depicted therein is a dual suspension actuator which is similar to the actuator 421 depicted in FIG. 11, except for the point of attachment of the additional springs. The actuator 441 depicted therein comprises a housing 443 having a permanent magnet 445 disposed therein. A diaphragm 447 is provided in the housing 443 which has a voice coil 449 suspended therefrom such that the voice coil 449 extends into a gap between the permanent magnet 445 and the housing 443.

The diaphragm 447 is attached to the housing 443 by way of a surround 451, and further by way of one or more springs 453 which are attached to the bottom of the housing 443 in the vicinity of the permanent magnet 445. The additional springs 453 provide a further restoring force to the diaphragm 447, thereby helping to eliminate distortions of the diaphragm 447 which might contribute the audible footprint of the actuator 441.

Figure 13:
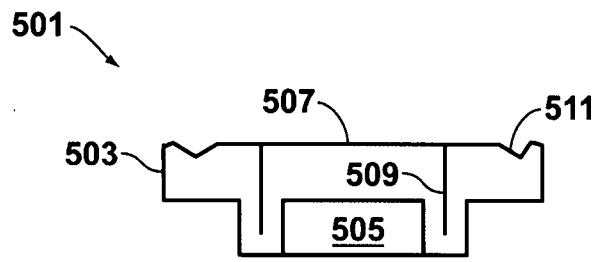
FIG. 13 is an illustration of a synthetic jet actuator in accordance with the teachings herein.

FIG. 13 depicts a single suspension actuator for a synthetic jet ejector. The actuator 501 depicted in FIG. 13 comprises a housing 503 within which resides a permanent magnet 505. A diaphragm 507 is spaced apart from the magnet 505 and is equipped with a coil 509 that extends into the space between the magnet 505 and the housing 503 (note that the figure is cross-sectional, so that the coil 509, though preferably cylindrical, appears as two parallel lines). The diaphragm 507 is supported from the housing 503 by way of a surround 511.

Figure 14:
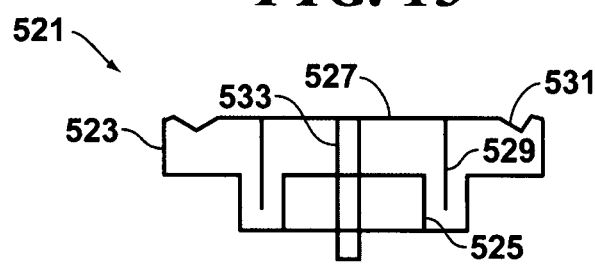
FIG. 14 is an illustration of a synthetic jet actuator in accordance with the teachings herein.

FIG. 14 illustrates a further specific, non-limiting embodiment of an actuator for a synthetic jet ejector made in accordance with teachings herein. The actuator 521 comprises a housing 523 having a permanent magnet 525 attached to a surface thereof. A diaphragm 527 is provided which has a voice coil 529 suspended therefrom such that the voice coil 529 extends into a gap between the permanent magnet 525 and the housing 523. An alignment pin 533 is also attached to the diaphragm and extends through a central aperture in the permanent magnet 525 and the housing 523. The actuator 521 depicted in FIG. 14 is similar in some respects to the actuator 301 depicted in FIG. 8, except that the permanent magnet 525 in the actuator 521 of FIG. 14 is attached to the diaphragm 527 rather than to the bottom of the housing 523.

Preferably, a viscous seam exists between the permanent magnet 525 and the alignment pin 533, and which may be maintained through application of a suitable lubricant. In use, as the diaphragm 527 moves up and down along the vertical axis of the alignment pin 533 in response to the polarity of the voice coil 529, the alignment pin 533 moves up and down within the aperture in the permanent magnet 525. In so doing, the alignment pin 533 prevents the diaphragm 527 from moving in an off-axis direction, thereby helping to reduce or eliminate distortions which might contribute to the audible footprint of the actuator 521.

Figure 15:
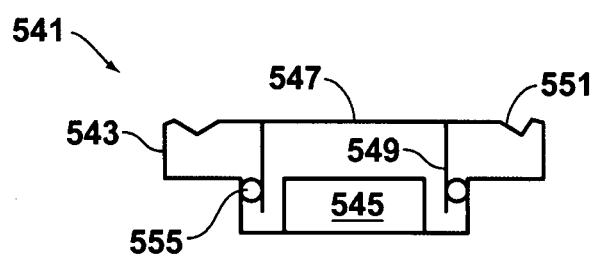
FIG. 15 is an illustration of a synthetic jet actuator in accordance with the teachings herein.

FIG. 15 depicts a specific, non-limiting embodiment of a single suspension actuator for a synthetic jet ejector made in accordance with the teachings herein. The actuator 541 depicted therein is similar in most respects to the actuator 501 depicted in FIG. 13. Thus, the actuator 541 comprises a housing 543 within which resides a permanent magnet 545. A diaphragm 547 is spaced apart from the magnet 545 and is equipped with a coil 549 that extends into the space between the magnet 545 and the housing 543. The diaphragm 547 is supported from the housing 543 by way of a surround 551.

However, unlike the actuator 501 depicted in FIG. 13, the actuator 541 of FIG. 15 comprises a set of rollers 555 upon which the voice coil 549 moves. The rollers 555 permit the free movement of the voice coil 549 in the vertical direction, but eliminate lateral movement of the voice coil 549. This, in turn, can reduce or eliminate distortions which might contribute to the audible footprint of the actuator 541.

It will be appreciated that the rollers 555 in FIG. 15 may take a number of forms, and in some embodiments may be replaced by other devices that provide a similar functionality. Thus, for example, in some embodiments, the rollers may be in the form of conventional cylinder rollers that rotate about an axis or core mounted on the sidewall of the housing 543. In other embodiments, one or more ball bearings may be substituted for the rollers. In still other embodiments, a washer or set of protrusions or tabs may be provided which comprise polytetrafluoroethylene (PTFE) or another suitable low friction surface that permits relatively free movement of the voice coil in the vertical direction, while limiting movement of the voice coil in the transverse traction.

Figure 16:
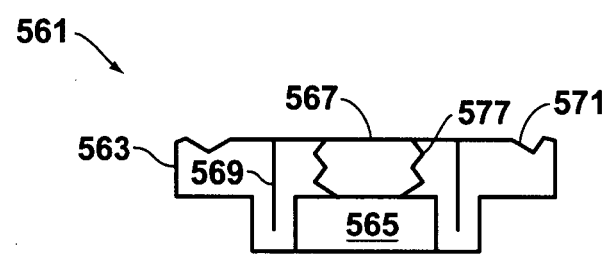
FIG. 16 is an illustration of a synthetic jet actuator in accordance with the teachings herein.

FIG. 16 depicts a further specific, non-limiting embodiment of a single suspension actuator for a synthetic jet ejector made in accordance with the teachings herein. The actuator 561 depicted therein is similar in most respects to the actuator 501 depicted in FIG. 13. Thus, the actuator 561 comprises a housing 563 within which resides a permanent magnet 565. A diaphragm 567 is spaced apart from the magnet 565 and is equipped with a voice coil 569 that extends into the space between the magnet 565 and the housing 563. The diaphragm 567 is supported from the housing 563 by way of a surround 571.

However, unlike the actuator 501 depicted in FIG. 13, the actuator 561 of FIG. 16 comprises one or more additional springs 577 or suspensions which contribute an additional restoring forced to the diaphragm 567. This additional restoring force may help to reduce or eliminate lateral movement of the voice coil 569, which in turn can reduce or eliminate distortions which might contribute to the audible footprint of the actuator 561.

Figure 17:
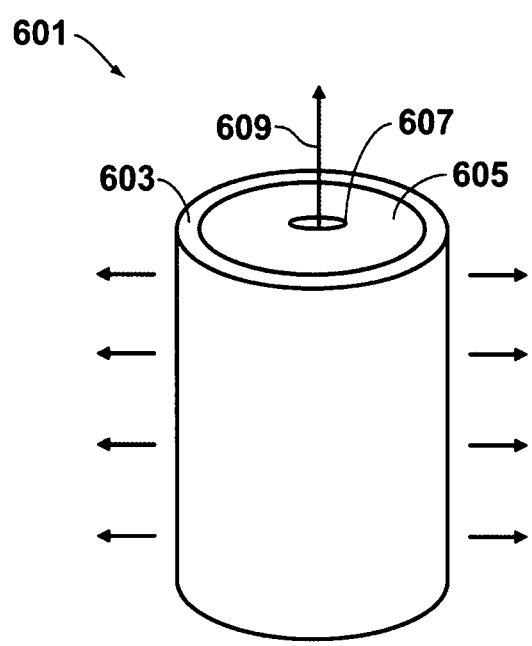
FIG. 17 is a three-dimensional actuator in accordance with the teachings herein.

FIG. 17 illustrates a particular, non-limiting embodiment of a 3-dimensional actuator made in accordance with the teachings herein. In the particular embodiment depicted, the 3-D actuator 601 comprises a piezoelectric layer 603 and a base layer 605. Either of these layers may itself consist of one or more layers comprising one or more materials. In the particular embodiment depicted, the piezoelectric layer 603 is the outer layer of the actuator 601, and the base layer 605 is the inner layer. However, in other embodiments, the piezoelectric layer 603 may be the inner layer, and the base layer 605 may be the outer layer. The base layer 605 may comprise, for example, a laminate of a low modulus layer and a high modulus layer, and the piezoelectric layer 603 may comprise a piezoelectric material.

The 3-D actuator 601 is preferably provided with an inner electrode and an outer electrode (not shown) which are adapted to apply a potential to the piezoelectric layer 603. In the particular embodiment depicted, the 3-D actuator 601 is designed to expand and contract laterally as indicated by the arrows when a voltage applied between the electrodes is oscillated between a first and second voltage. More generally, however, the actuator may be constructed such that it will contract and expand laterally (radially) and/or longitudinally when a voltage is varied between their inner and outer electrodes. During the contraction portion of the cycle, a synthetic jet 609 is emitted from an aperture 607 or nozzle located in a terminal portion of the device.

In other embodiments of the 3-D actuator 601, the actuator 601 is not itself provided with an aperture or nozzle, but is disposed within a housing that is provided with one or more apertures or nozzles such that the expansion of the actuator causes one or more synthetic jets to be emitted from the apertures or nozzles.

While the 3-D actuator 601 depicted in FIG. 16 is cylindrical in shape, 3-D actuators of this type may be fabricated which have a variety of exterior and interior geometries, and these geometries may be independently selected. Thus, for example, the inner or outer geometries may be circular, elliptical, polygonal (e.g., square, rectangular, triangular, pentagonal, or hexagonal) in cross-section. As one particular, non-limiting example of such an embodiment, both the exterior and interior of the actuator may be cylindrical in shape. In another particular, non-limiting example, the exterior may be rectangular in shape, and the interior may be cylindrical in shape.

Moreover, the expansion and/or contraction of the actuator need not be symmetrical, and need not be simultaneous across the surface, or surfaces, of the actuator. Thus, for example, the actuator can be adapted to expand and/or contract through various linear and nonlinear profiles, thereby and applying various pressure gradients to the interior chamber of the device (or to the interior volume of the housing within which the actuators disposed) so as to achieve, for example, a desired synthetic jet profile. As a specific example, the exterior walls of the actuator may be adapted to expand linearly, and the expansion may commence at the bottom portion of the wall, or at the middle portion of the wall. It will also be appreciated that various portions of the actuator maybe adapted to expand and/or contract to different extents.

The 3-D actuator 601 may be adapted to operate at various voltages, and may also be equipped with various accessories such as amplifiers, drivers, controllers and housings. It may also be equipped with various electrode types. Thus, for example, fired silver-plated electrodes maybe be utilized as the inner electrodes, and thin film electrodes (such as copper-nickel or gold electrodes) may be utilized as the outer electrodes.

The axial contraction and radial displacement of 3-D tubular piezoelectric actuators can be estimated by the following equations:

$$\Delta L \approx d_{31} \cdot L \cdot \frac{U}{d} \quad \text{(EQUATION 1)}$$

where:
$d_{31}$=strain coefficient (displacement normal to polarization direction) [m/V];
L=length of the tube (in m);
U=operating voltage (in V); and
d=wall thickness (in m); and $$\Delta d \approx d_{33} \cdot U \quad \text{(EQUATION 2)}$$

where:
$\Delta d$=change in wall thickness [m];
$d_{33}$=strain coefficient (field and displacement in polarization direction) (in m/V); and
U=operating voltage (in V).

The radial contraction is the superposition of the increase in wall thickness and the tangential contraction; it can be estimated by the following equation:

$$\frac{\Delta r}{r} \approx d_{31} \cdot \frac{U}{d} \quad \text{(EQUATION 3)}$$

where:
r=tube radius;
$d_{31}$=strain coefficient (displacement normal to polarization direction) (in m/V);
U=operating voltage (in V); and
d=wall thickness (in m).

Figure 19:
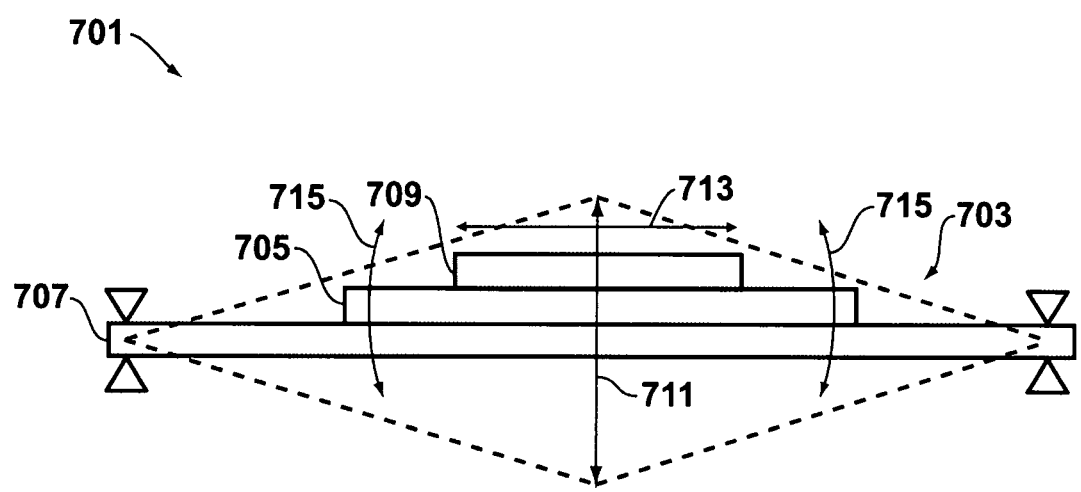
FIG. 19 is an illustration of one embodiment of a laminated actuator in accordance with the teachings herein which comprises a piezoceramic layer, a high modulus polymeric layer, and a low modulus polymeric layer.
Figure 20:
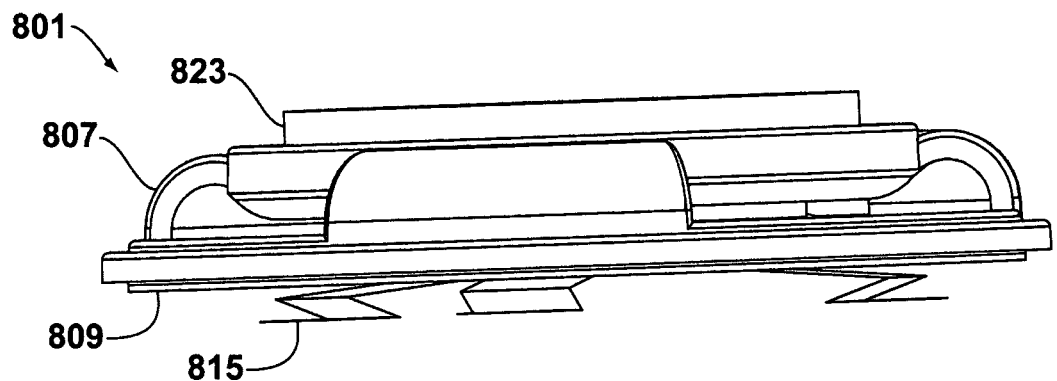
FIG. 20 is a side view of one embodiment of a supplemental suspension spring synthetic jet actuator in accordance with the teachings herein.
Figure 21:
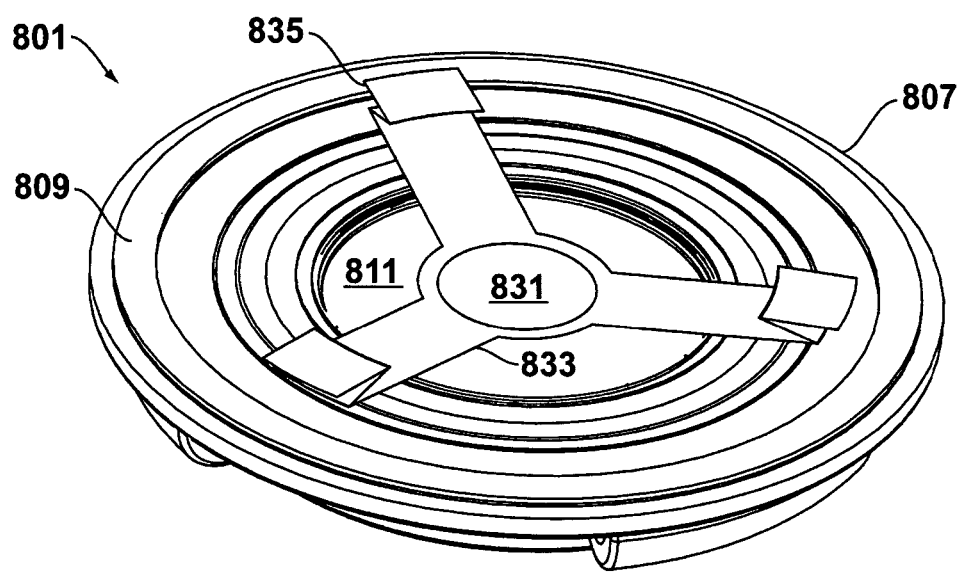
FIG. 21 is a perspective view the supplemental suspension spring synthetic jet actuator of FIG. 20.
Figure 22:
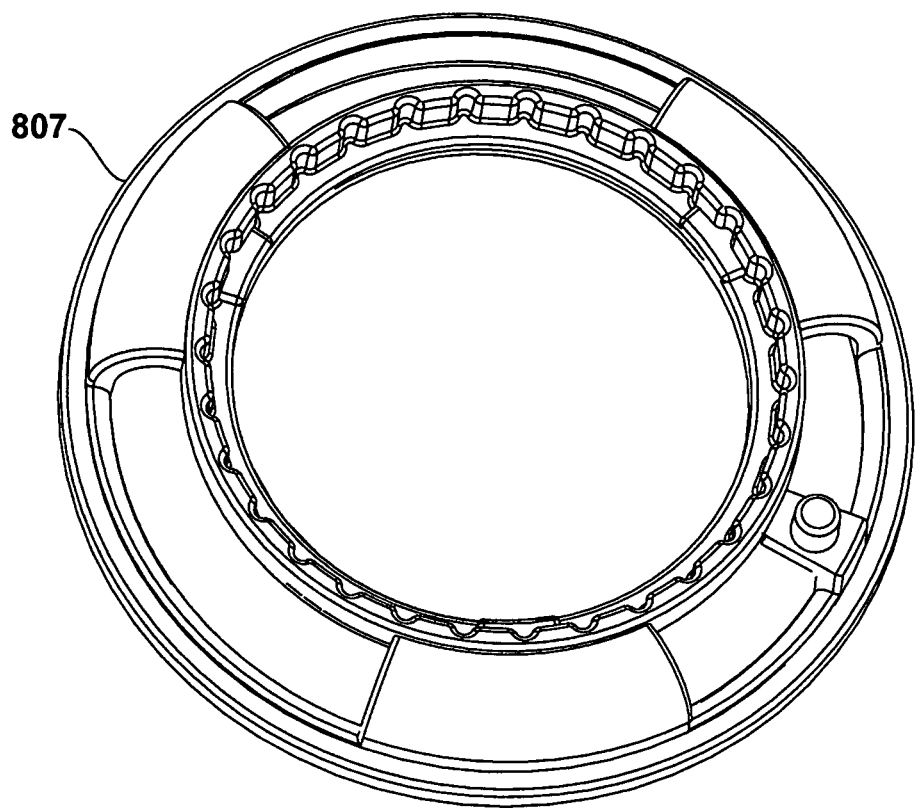
FIG. 22 is a perspective view of the basket of the synthetic jet actuator of FIG. 20.
Figure 23:
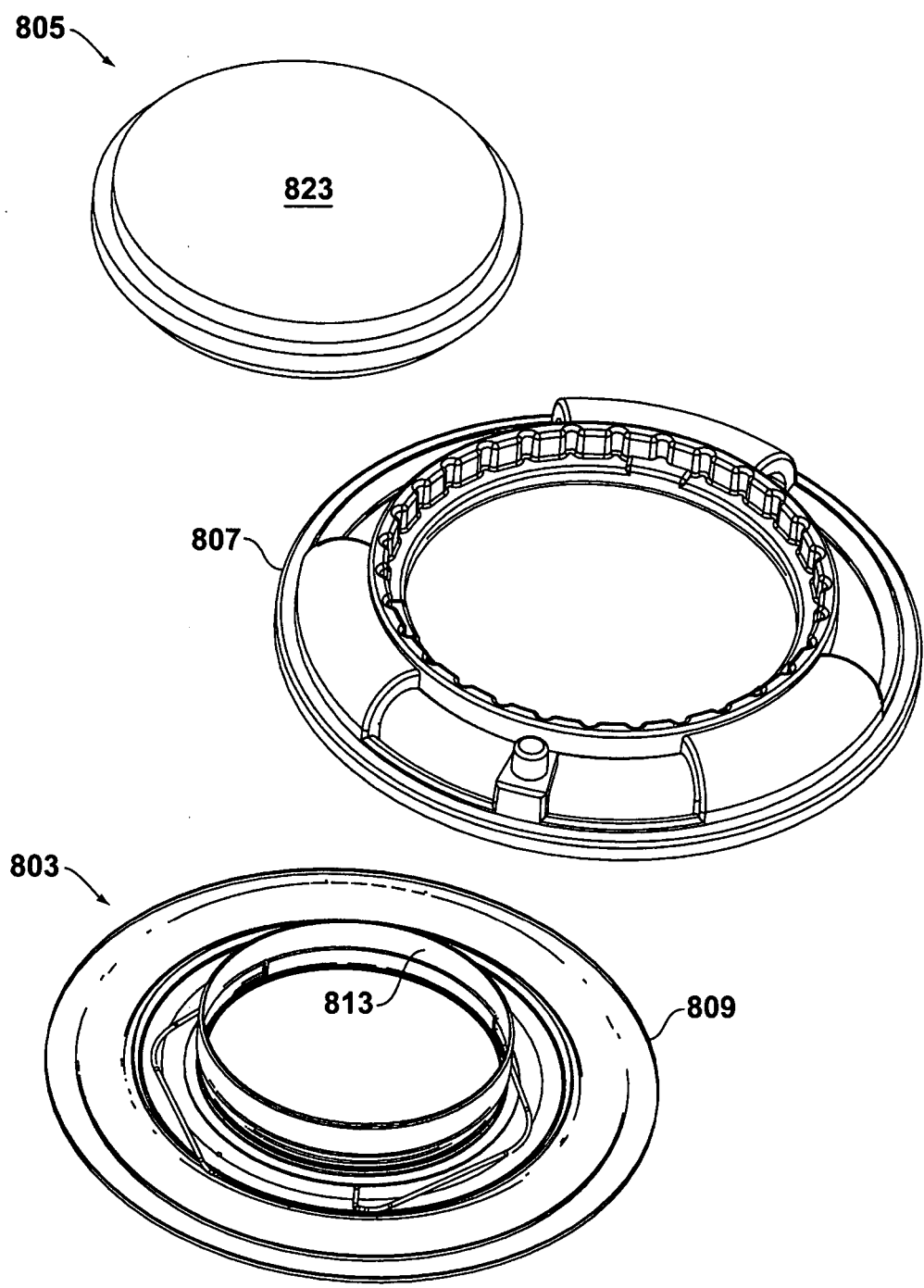
FIG. 23 is a perspective view of the basket, magnet, and coil of the synthetic jet actuator of FIG. 20.

With reference now to FIG. 19, a further specific, non-limiting embodiment of a piezoelectric actuator is provided. In this particular embodiment, the actuator 701 comprises a base layer 703 which comprises a high modulus layer 705 of a high modulus material such as a metal, and a low modulus layer 707 comprising a low modulus material such as a polymeric layer. A piezoelectric layer 709, which in this particular embodiment comprises a piezoceramic material, is disposed on the base layer 703.

In use, the high modulus layer 705 acts to transmit shear stress to the low modulus layer 707. The base layer 703 is characterized by a resonance frequency and displacement which depend on the length, thickness and materials composition, as well as the input voltage and the dielectric constant of the piezoelectric layer 709. Arrows 711, 713 and 715 depict the respective motion of the low modulus layer 707, the piezoelectric 713 and 715 depict the respective motion of the low modulus layer 707, the piezoelectric layer 709 and the high modulus layer 705 when a voltage is applied to the piezoelectric layer 709.

Various modifications and substitutions may be made to the structure depicted in FIG. 19 without departing from the scope of the present invention. For example, any of the base layer 703, the high modulus layer 705, the low modulus layer 707 or the piezoelectric layer 709 may comprise one or more component layers. Thus, for example, in some embodiments, the base layer may consist of a single layer of a single material (that is, the device may be a unimorph). In other embodiments, multiple layers of high modulus material may be utilized in the high modulus layer 705.

The piezoelectric layer 709 may comprise various materials. These include, without limitation, modified lead zirconate titanate (PZT), barium titanate, lithium niobate, and polyvinyledene difluoride (PVDF). The low modulus layer may comprise, without limitation, various polyolefins (such as, for example, polyethylene) or polyesters.

FIGS. 20-27 illustrate a further particular, non-limiting embodiment of an actuator made in accordance with the teachings herein. The actuator 801 comprises a coil assembly 803 (see FIG. 23), a magnet assembly 805 and a basket 807. The coil assembly 803 comprises a suspension 809 (see FIG. 26), a diaphragm 811, a voice coil 813, and a suspension spring 815. The magnet assembly 805 comprises a permanent magnet 817, a pole piece 819, a return path 821 and a magnet housing 823. A terminal 825 is provided to connect the device to wire leads.

Figure 24:
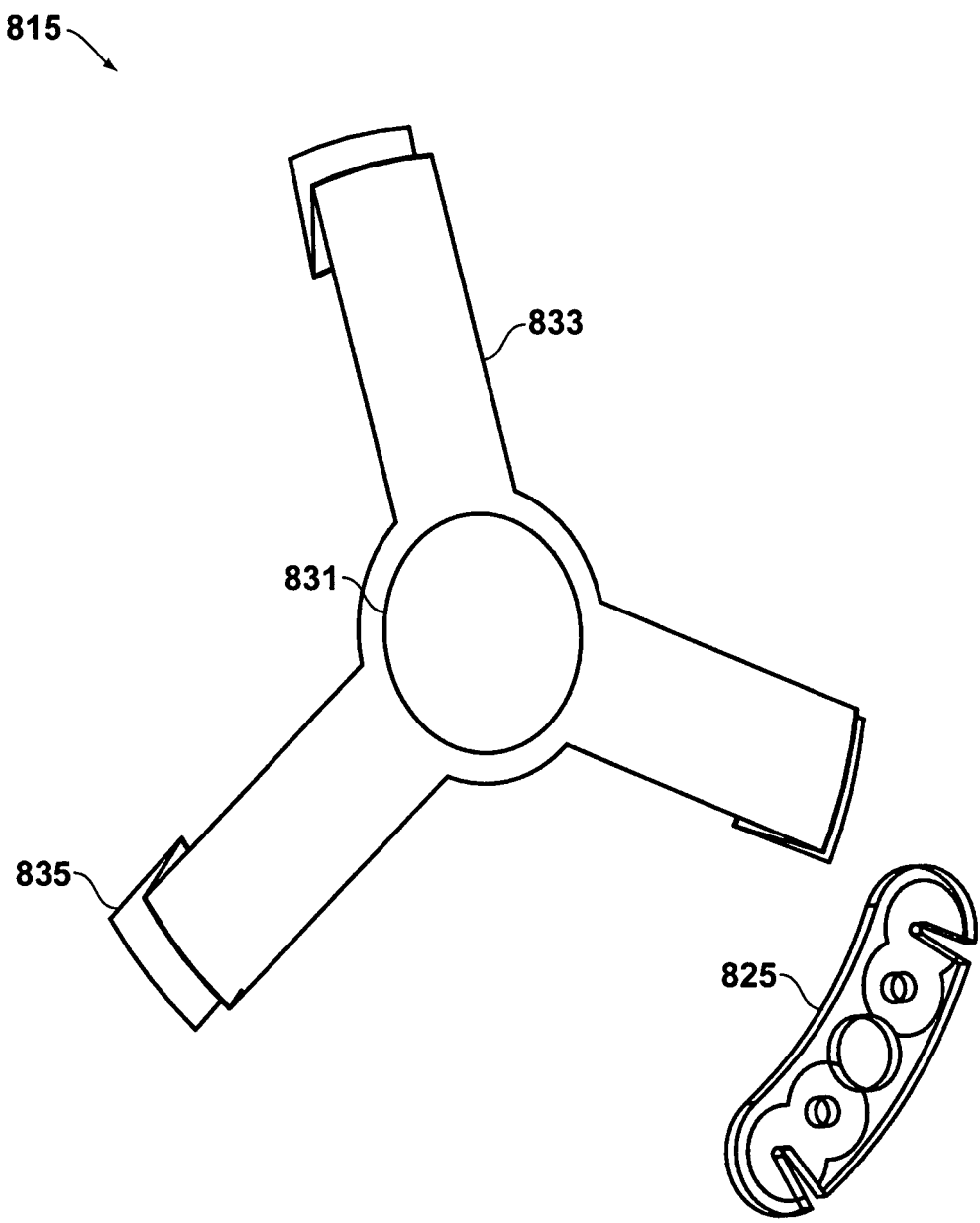
FIG. 24 is a perspective view of the suspension spring and bracket of the synthetic jet actuator of FIG. 30.
Figure 25:
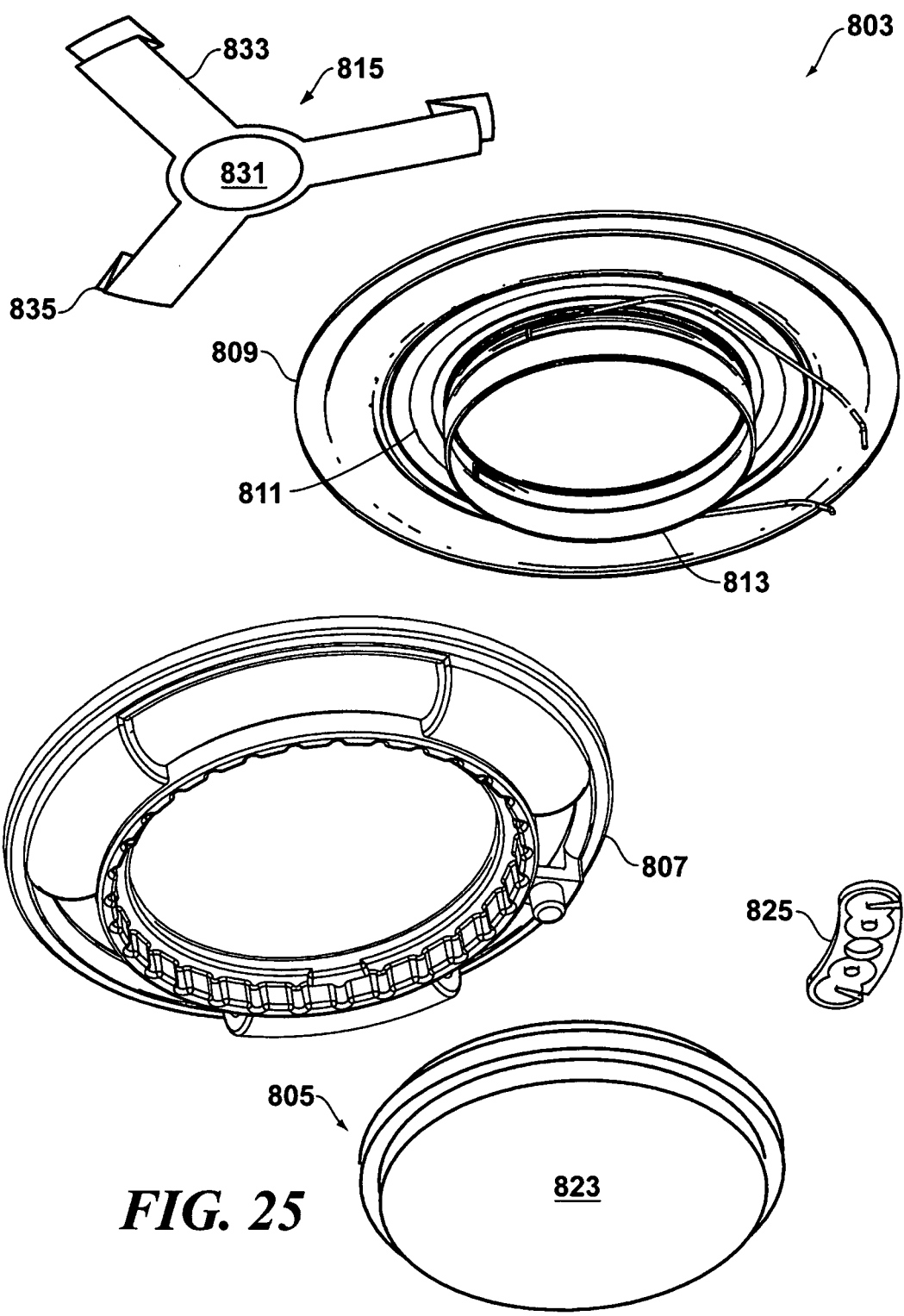
FIG. 25 is a perspective view of the basket, magnet, and coil of the synthetic jet actuator of FIG. 20.
Figure 26:
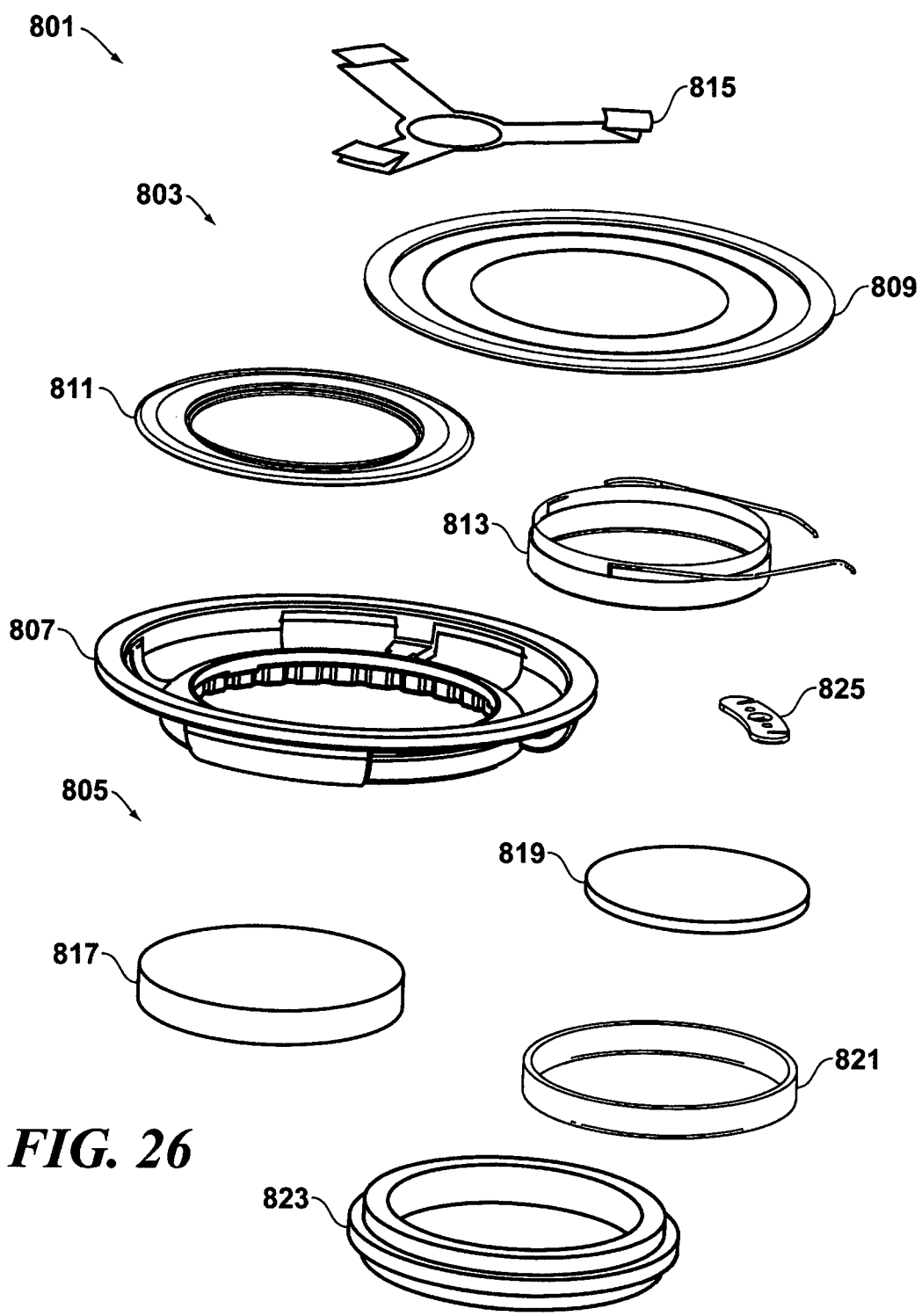
FIG. 26 is an exploded view of the synthetic jet actuator of FIG. 20.
Figure 27:
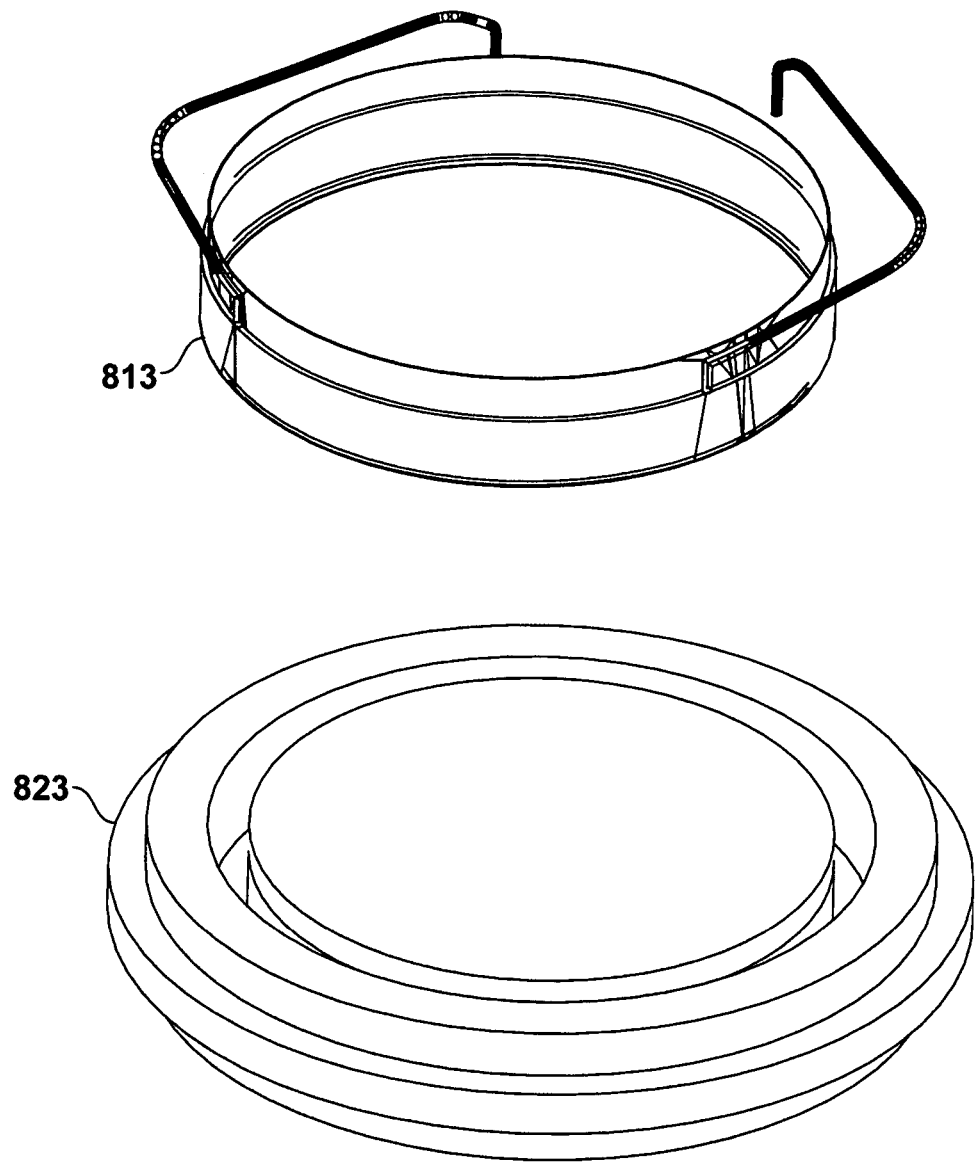
FIG. 27 is a perspective view of the magnet assembly and the coil of the synthetic jet actuator of FIG. 20 which illustrates how the two interface with each other.

The details of the suspension spring 815 may be understood with reference to FIG. 24. As seen therein, the suspension spring 815 comprises a central hub 831 to which are attached a plurality of arms 833. The suspension spring 815 preferably comprises stainless steel or carbon spring steel, but may also comprise other such materials as are known to the art.

In the particular embodiment depicted, the suspension spring 815 has three arms, though it will be appreciated that various embodiments are possible which may be equipped with more or less arms. The hub 831 may be attached to the diaphragm 833 through adhesive bonding, welding, swaging, mechanical attachment, or by other suitable means known to the art.

The terminal portions 835 of the arms 833 are likewise attached to the actuator housing or to the basket 807. The terminal portions 835 can either be physically attached to the actuator housing or basket 807, or they may simple press against them with inherent spring force. The terminal portions 835 are preferably in the form of a plurality of bends which interface with the actuator housing or basket 807. The plurality of bends in the terminal portions 835 serve to reduce translation force at the site of attachment.

As with many of the other embodiments of actuators disclosed herein, the provision of a suspension spring 815 of the type depicted in FIG. 24 in the actuator 801 is found to effectively reduce rocking and other types of non-linear diaphragm movement. In particular, during the actuator stroke, any portion of the diaphragm subjected to forces which would lead to more than average displacement will encounter greater spring force (either through compression or extension), which will thus act to reduce the displacement.

It will be appreciated that various modifications may be made to the suspension spring 815 depicted in FIG. 24. Thus, for example, various embodiments are possible which have four, five, six, or more arms. Preferably, the suspension spring 815 is constructed such that it has rotational symmetry. Embodiments are also possible in which the suspension spring 815 is incorporated into the diaphragm 811 and/or suspension 809. In some embodiments, the suspension spring 815 may also be replaced with an elastomeric webbing, membrane or strips, which may be placed upon, adhered to, or incorporated into the diaphragm 811 and/or suspension 809.

In addition to reducing the audible footprint of the actuators used in the synthetic jet ejectors described herein, other design optimizations may be made to improve the performance and/or the reliability of the device. For example, tinsel design is an important element in the reliability of an actuator utilized in a synthetic jet ejector. Current tinsel designs have several disadvantages, including their space consuming constructions and their susceptibility to fatigue failures.

It has been found that improved tinsels can be made for use in the devices described herein by replacing conventional tinseling with tinseling in the form of nanoparticle ink which is applied directly to the diaphragm of the actuator. The nanoparticle ink may be applied by air brush painting, ink jet printing, or through other suitable methodologies, and may be adhered to the diaphragm or other substrate through a photosetting process. The use of tinseling in the form of nanoparticle ink has a number of advantages, including the provision of a flexible electrical connection attached directly to the diaphragm, and the avoidance of routing issues (in this respect, it is to be noted that conventional tinseling must be carefully routed to prevent interferences and subsequent contributions to the audible footprint of the actuator).

It will be appreciated that, in the foregoing description of the methodologies and devices disclosed herein, usage has been made of common speaker terminology. For example, frequent reference has been made to voice coils herein. It is to be understood that such references are meant to identify the components of the devices described herein by analogy to like components that exist in speaker constructions, without intending to imply exactness of functionality.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A synthetic jet ejector, comprising:
    a housing;
    an actuator which is disposed in said housing and which is equipped with a diaphragm and a voice coil, wherein said diaphragm has first and second surfaces;
    a surround which supports said diaphragm; and
    at least one spring which is adapted to reduce the lateral movement of said diaphragm;
wherein said spring comprises a central hub equipped with a plurality of arms, wherein said central hub is attached to said first surface of said diaphragm, wherein said second surface faces said voice coil, and wherein each of said plurality of arms includes a first portion which extends linearly away from said hub and which terminates in a second, folded portion;
wherein said voice coil drives said diaphragm to create a fluidic flow into and out of said housing, and wherein said spring is exposed to said fluidic flow.

2. The synthetic jet ejector of claim 1, wherein said voice coil which depends from said diaphragm.

3. The synthetic jet ejector of claim 2, further comprising a permanent magnet.

4. The synthetic jet ejector of claim 3, wherein said voice coil terminates in a hollow cylindrical portion, and wherein said hollow cylindrical portion interfaces with a circular space between said magnet and said housing.

5. The synthetic jet ejector of claim 1, wherein said spring has a plurality of terminal portions which releasably engage said surround.

6. The synthetic jet ejector of claim 5, wherein each of said terminal portions contains at least one fold that releasably engages a groove in said surround.

7. The synthetic jet ejector of claim 5, wherein each of said arms terminates in one of said plurality of terminal portions.

8. The synthetic jet ejector of claim 1, further comprising a stationary permanent magnet;
    wherein said permanent magnet is disposed on a first side of said diaphragm, and wherein said at least one spring is attached to a portion of said housing which is adjacent to a second side of said diaphragm.

9. The synthetic jet ejector of claim 1, wherein said first portion is planar, and wherein said second portion is not coplanar with said first portion.

10. The synthetic jet ejector of claim 1, wherein said first portion is planar, and wherein said second portion extends along an axis that is not coplanar with said first portion.

11. The synthetic jet ejector of claim 1, wherein said first portion is planar, and wherein said second portion extends above the plane of said first portion.

12. The synthetic jet ejector of claim 1, wherein said second portion is attached directly to said first portion.

13. The synthetic jet ejector of claim 1, wherein said second portion comprises at least first and second planar segments.

14. The synthetic jet ejector of claim 13, wherein said first and second planar segments are joined along an axis.

15. The synthetic jet ejector of claim 14, wherein said first and second planar segments engage a complimentary shaped ridge on said surround.

16. The synthetic jet ejector of claim 1, wherein said plurality of arms includes first, second and third arms spaced equally about said hub.

17. The synthetic jet ejector of claim 1, wherein said central hub is attached across said first surface.

18. The synthetic jet ejector of claim 1, wherein the first surface is exposed to said fluidic flow.

19. The synthetic jet ejector of claim 1, wherein the second surface is not exposed to said fluidic flow.

20. A synthetic jet ejector, comprising:
    an actuator equipped with a diaphragm;
    a voice coil attached to said diaphragm;
    a housing; and
    at least one structure disposed between said voice coil and said housing which is adapted to reduce the lateral movement of said diaphragm;
wherein said at least one structure comprises a spring, wherein said voice coil drives said diaphragm to create a fluidic flow into and out of said housing, wherein said at least one structure is exposed to said fluidic flow, wherein said spring comprises a central hub equipped with a plurality of arms, and wherein each of said plurality of arms includes a first portion which extends linearly away from said hub and which terminates in a second, folded portion.

* * * * *